United States Patent [19]

Momodomi et al.

[11] Patent Number: 4,959,812

[45] Date of Patent: Sep. 25, 1990

[54] ELECTRICALLY ERASABLE PROGRAMMABLE READ-ONLY MEMORY WITH NAND CELL STRUCTURE

[75] Inventors: Masaki Momodomi; Fujio Masuoka, both of Yokohama; Riichiro Shirota; Yasuo Itoh, both of Kawasaki; Kazunori Ohuchi; Ryouhei Kirisawa, both of Yokohama, all of Japan

[73] Assignee: Kabushiki Kaisha Toshiba, Kawasaki, Japan

[21] Appl. No.: 289,702

[22] Filed: Dec. 27, 1988

[30] Foreign Application Priority Data

Dec. 28, 1987 [JP] Japan .................. 62-329781

[51] Int. Cl.$^5$ ............................................. G11C 17/00
[52] U.S. Cl. .................................... 365/185; 365/104; 357/23.5
[58] Field of Search ........... 365/182, 104, 185, 230.03, 365/218; 357/23.5, 45

[56] References Cited

U.S. PATENT DOCUMENTS 4,677,590 6/1987 Arakawa .............................. 365/185

FOREIGN PATENT DOCUMENTS 60-8559 3/1985 Japan .
60-182162 9/1985 Japan .

OTHER PUBLICATIONS

"A High Density EPROM Cell and Array", Symposium on VLSI Technology Digest of Technical Papers; pp. 89-90; May 1986; R. Stewart et al.

Primary Examiner—Joseph A. Popek
Attorney, Agent, or Firm—Oblon, Spivak, McClelland, Maier & Neustadt

[57] ABSTRACT

An erasable programmable read-only memory with NAND cell structure is disclosed which has memory cells provided on a N type substrate. The memory cells are divided into NAND cell blocks each of which has a series array of memory cell transistors. Each of the transistors has a floating gate, a control gate connected to a word line and N type diffusion layers serving as its source and drain. These semiconductor layers are formed in a P type well layer formed in a surface area of a substrate. The well layer serves as a surface breakdown prevention layer. During a data erase mode data stored in all the memory cells are erased simultaneously. During the data write mode subsequent to the erase mode, when a certain NAND cell block is selected, memory cells in the NAND cell block are subjected to data writing in sequence. When data is written into a certain memory cell in the selected NAND cell block, a control gate of the certain memory cell is supplied with a voltage which is so high as to form a strong electric field to allow the tunneling of electrons between the floating gate of the memory cell and the well layer. Consequently, only the selected cell can be written into.

15 Claims, 14 Drawing Sheets

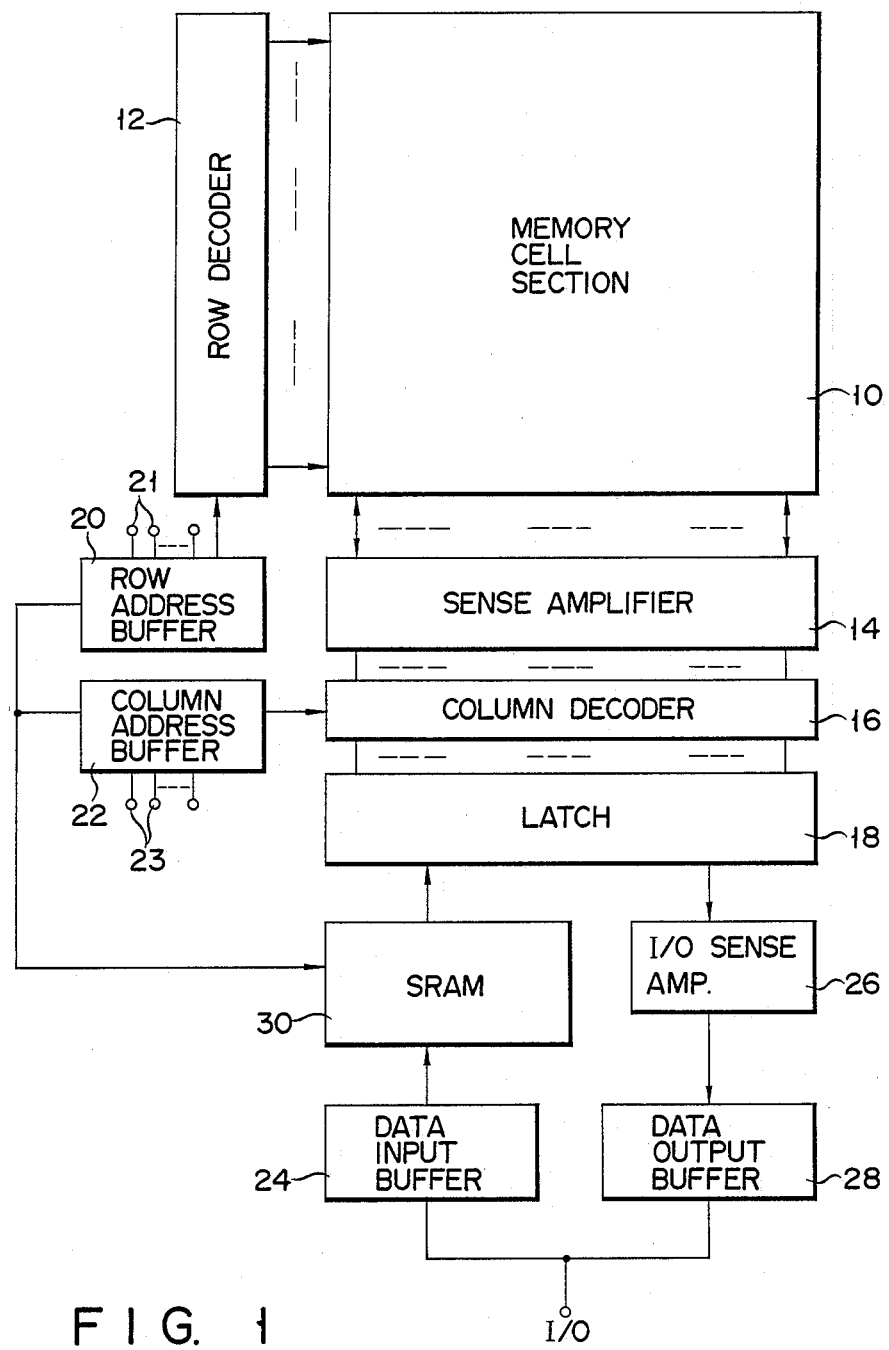
F I G. 1

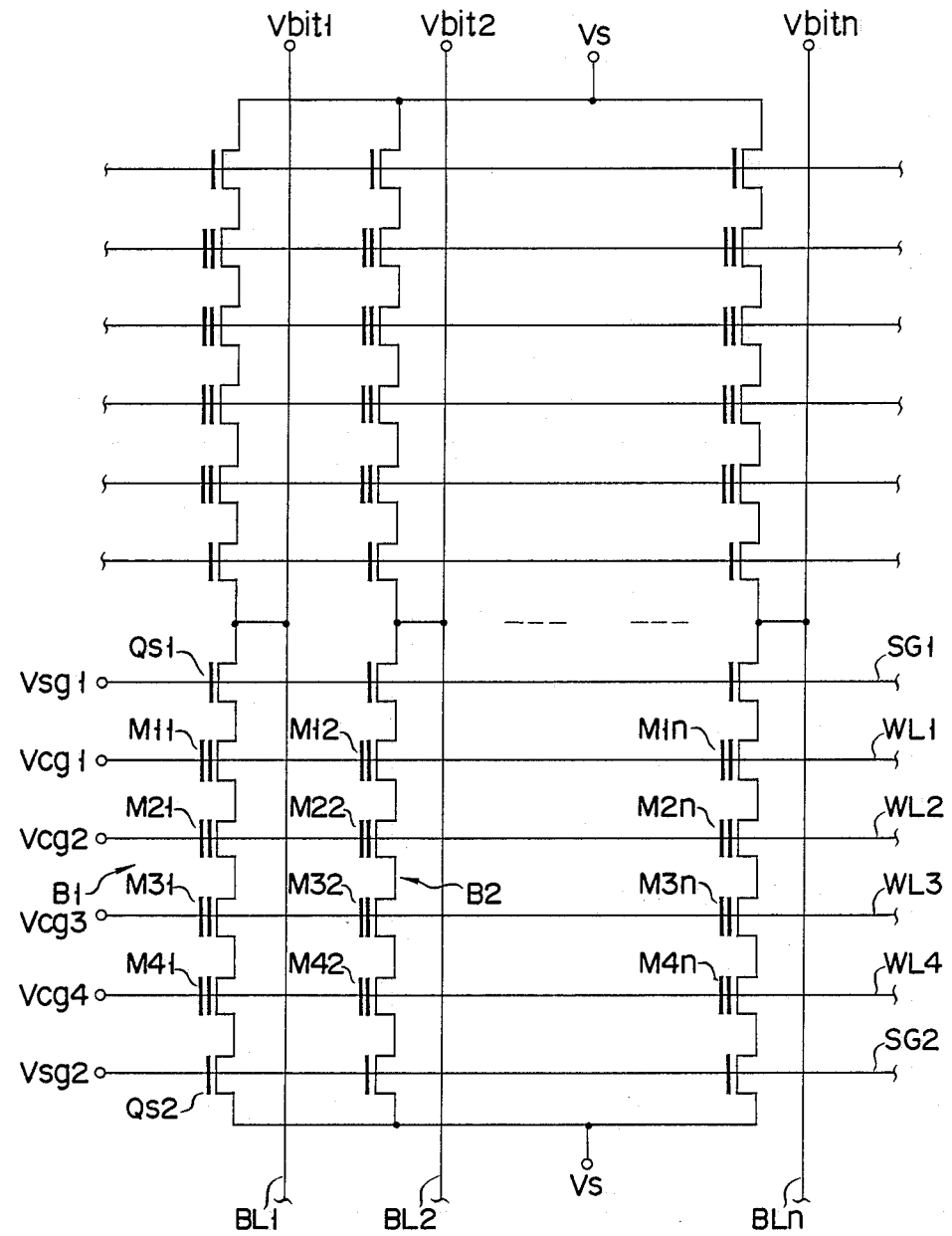
F I G. 2

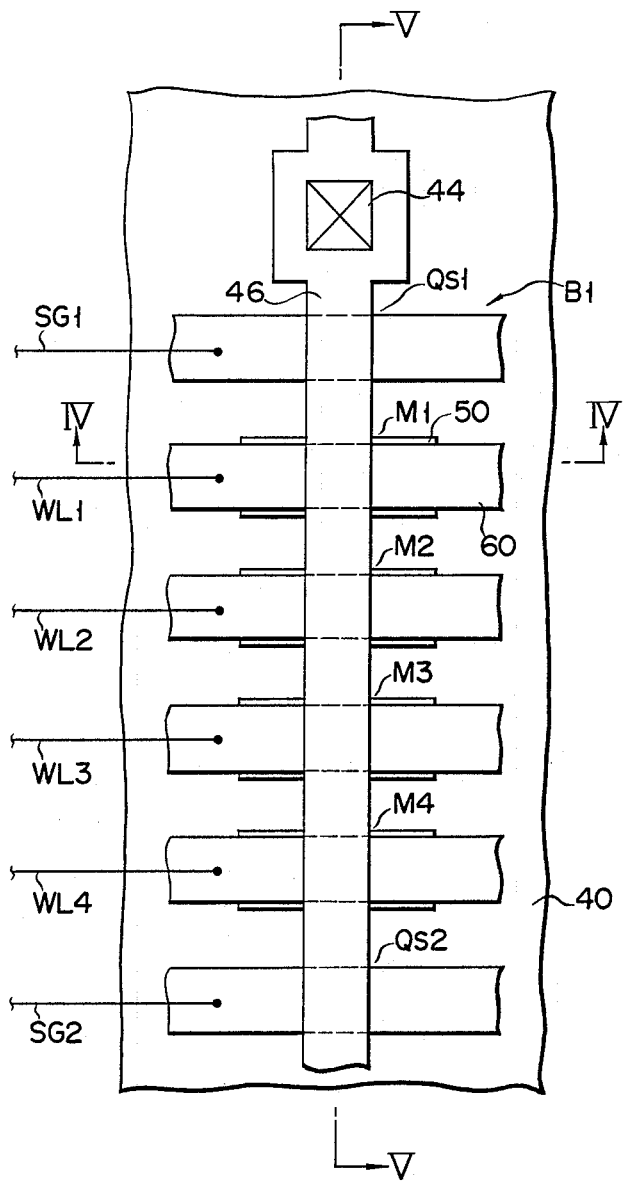
F I G. 3

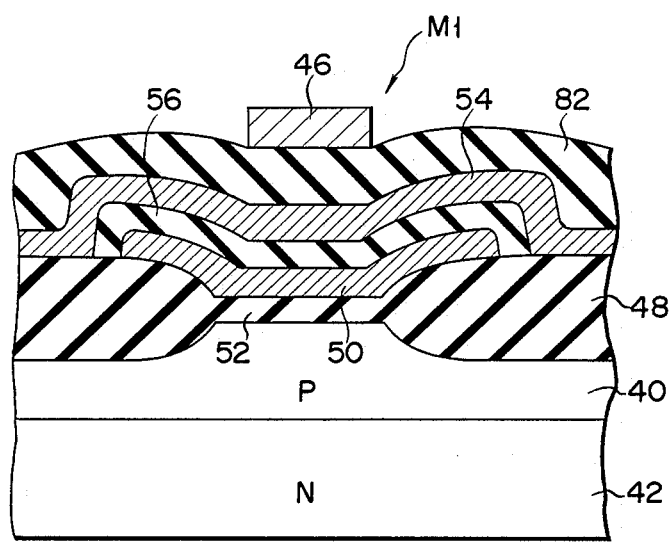
F I G. 4

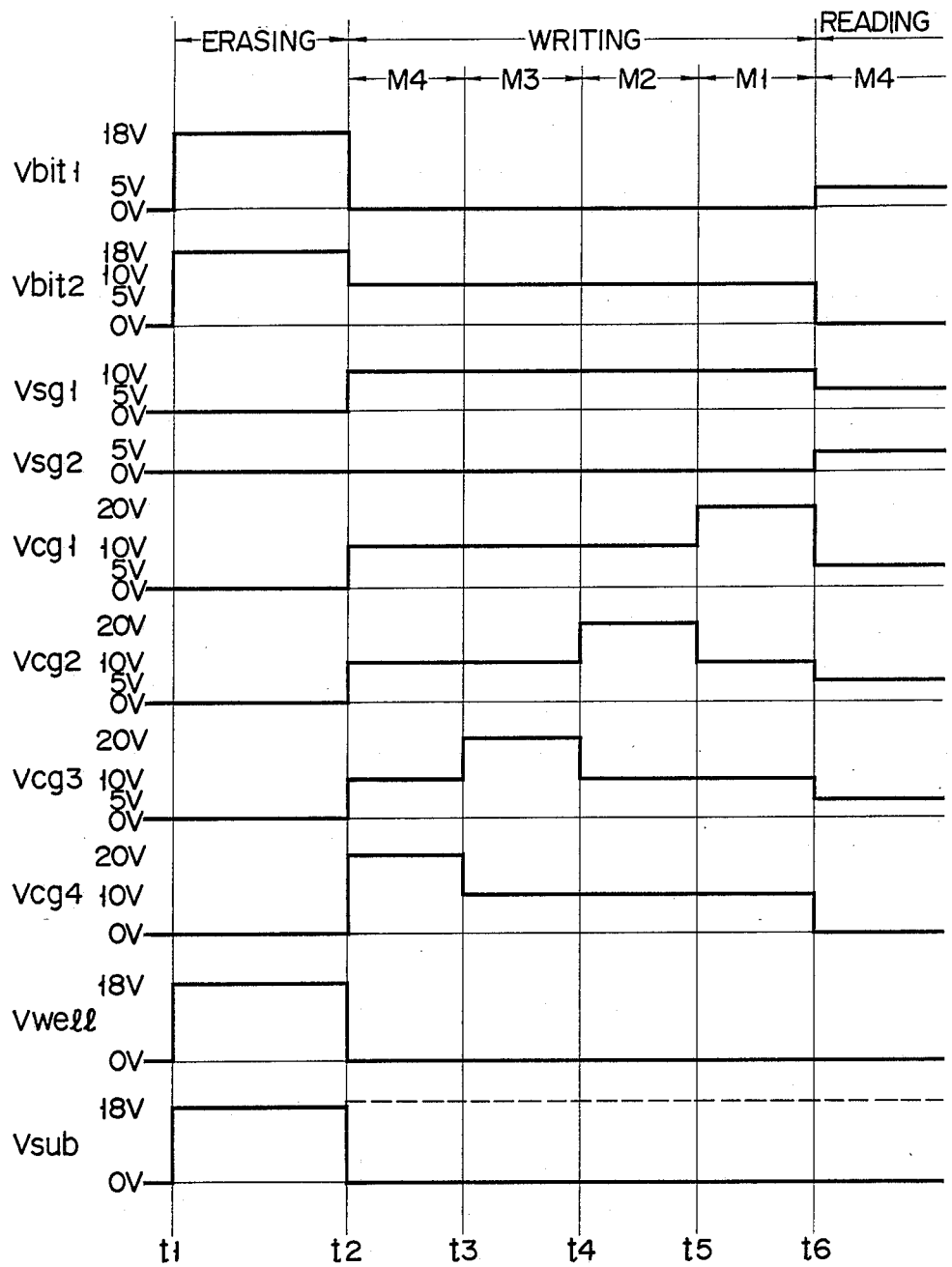
F I G. 6

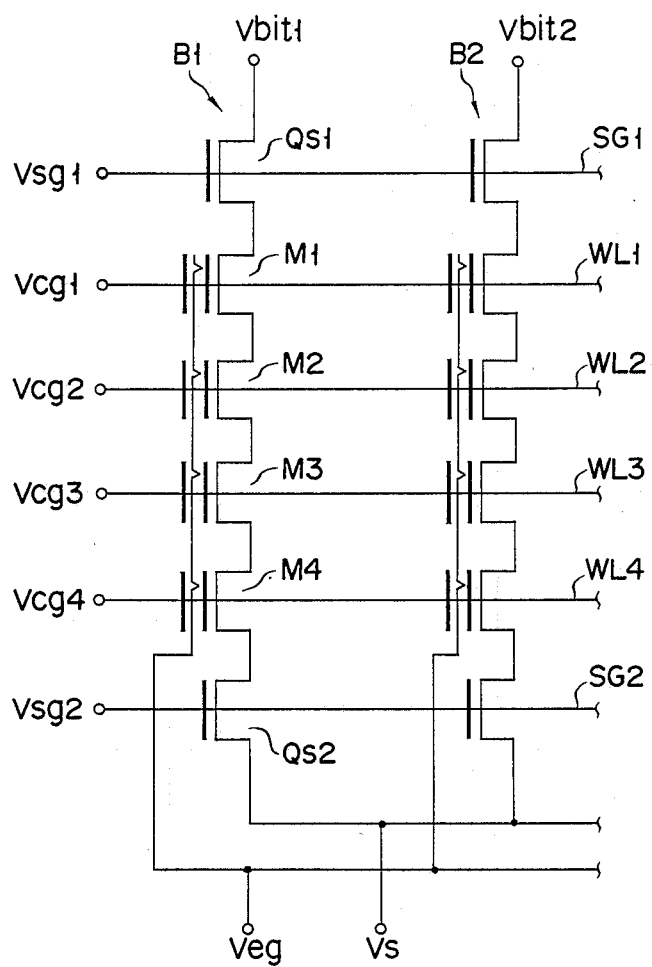
F I G. 13

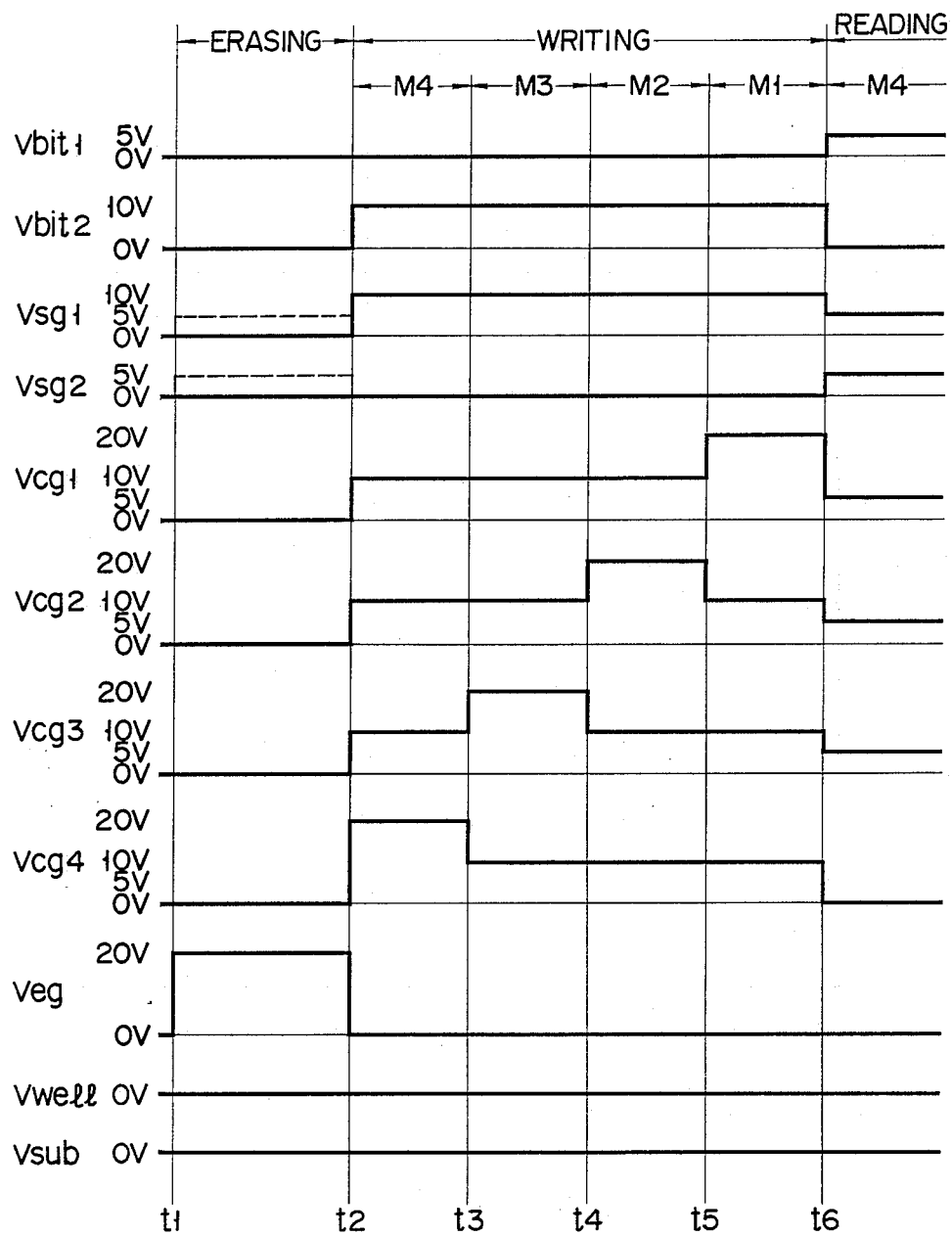
F I G. 14

ELECTRICALLY ERASABLE PROGRAMMABLE READ-ONLY MEMORY WITH NAND CELL STRUCTURE

BACKGROUND OF THE INVENTION

1. Field of the Invention

The present invention relates to non-volatile semiconductor memories and, more particularly, to electrically erasable programmable read-only memories with large storage capacity.

2. Description of the Related Art

With the increasing needs for high performance and reliability of digital computer systems, the development of a semiconductor memory has strongly been demanded that has enough storage capacity to replace an existing non-volatile data storage device, such as a magnetic floppy disk unit, for computers. As compared with magnetic disk storage devices, such as a floppy disk unit and a hard disk unit, a presently available electrically erasable programmable semiconductor read-only memory is reliable and fast in data writing/reading speed. However, the electrically erasable programmable semiconductor read-only memory is not still large in data storage capacity enough to replace the above magnetic data storage devices.

In a conventional electrically erasable programmable read-only memory (abbreviated to "EEPROM" hereinafter), each memory cell is typically composed of two transistors and data is randomly written or erased one byte at a time. Hence, such high-density integration of the EEPROM as provides large storage capacity enough to replace the peripheral data storage devices will be difficult to expect.

Recently, as a non-volatile semiconductor memory which is integrated at high density and thus has a large storage capacity, an erasable programmable read-only memory has been developed that has a "NAND type cell" structure. This type of memory device is typically designed such that: (1) each memory cell utilizes one transistor having a floating gate and a control gate; and (2) a single contact is provided between an array of memory cells arranged on a substrate to constitute an "NAND cell structure" and a corresponding bit line. Hence, as compared with the conventional EEPROM, the area occupied by memory cells can considerably be reduced and thus the integration density can be improved.

However, the conventional NAND cell type EEPROM is suffering from problems of the large current dissipation and the surface voltage drop (known as "surface breakdown") which occurs in the memory cells of the NAND cell blocks at the time of data writing. For example, according to conventional devices, the data writing into a selected memory cell is achieved by injecting electrons from a chip substrate into the floating gate of the memory cell through hot-electron injection. The injection of electrons through hot-electron injection undesirably increases the current dissipation in EEPROM. Semiconductor diffusion layers serving as drains and sources of series-arrayed cell transistors of a selected NAND cell block are directly formed in a surface portion of a chip substrate of an opposite conductivity type. When a boosted potential is applied to sources and drains of the remaining nonselected cell transistors in order to write data into a selected memory cell transistor of the NAND cell block, the surface breakdown will occur in the diffusion layers of the remaining transistors. The surface breakdown in the diffusion layers not only prevents effective data writing into the selected cell but also causes a variation of the thresholds of the nonselected cells. This will result in degradation of the operational reliability of the EEPROM.

SUMMARY OF THE INVENTION

It is accordingly an object of the present invention to provide a novel and improved non-volatile semiconductor memory.

It is another object of the present invention to provide a novel and improved electrically erasable programmable read only memory which is high-density integrated to have large storage capacity and has high operational reliability.

In accordance with the above objects, the present invention is addressed to specific nonvolatile dynamic semiconductor memory device comprising: a semiconductive substrate; parallel bit lines formed over the substrate; and rewritable memory cells connected to the bit lines. The memory cells comprise NAND cell blocks each of which has a series array of memory cell transistors. Each of the transistors has a charge accumulation layer, such as a floating gate, a control gate and semiconductive layers serving as its source and drain. These semiconductive layers are formed in a semiconductive well area. The well area is formed on the surface of the substrate separate from a well area in which transistors constituting a peripheral circuit of the memory device are formed. The well area serves as a surface breakdown prevention layer of the memory cell transistors. Parallel word lines are formed over the substrate to intersect the bit lines and connected to the gates of the transistors. The peripheral circuit includes a driving circuit, which is arranged to simultaneously erase data stored in all the memory cells during a data erase mode of the device and sequentially write data into memory cells of a selected NAND cell block during a data write mode subsequent to the data erase mode. When a certain memory cell of the selected NAND cell block is subjected to writing, its control gate is supplied with a voltage which forms such a strong electric field as to allow the transfer of charges between the charge accumulation layer of the certain memory cell and the well area. This allows the data writing only in the selected cell.

The present invention and its objects and advantages will become more apparent from the detailed description of the preferred embodiments presented hereinafter.

BRIEF DESCRIPTION OF THE DRAWINGS

In the detailed description of preferred embodiments of the invention presented below, reference is made to the accompanying drawings of which:

FIG. 1 schematically shows the overall circuit arrangement of an electrically erasable programmable read-only memory according to a preferred embodiment of the invention;

FIG. 2 snows the internal arrangement of a memory section in the EEPROM of FIG. 1 wherein memory cells are divided into NAND cell blocks each of which includes memory cell transistors series connected with first and second selection transistors so as to constitute a NAND cell structure;

FIG. 3 is a plan view of a certain NAND cell block;

FIG. 4 is a sectional view of the NAND cell block of FIG. 3, taken along the line 4—4 of FIG. 3;

FIGS. 6 and 7 waveforms of main electrical signals appearing at main portions of the EEPROM of FIG. 1 during its various modes of operation;

FIG. 13 is an equivalent circuit diagram of the NAND cell block of FIG. 11; and

FIG. 14 illustrates waveforms of main electrical signals appearing in main portions of the EEPROM having the NAND cell block of FIG. 11 during various modes of operation of the EEPROM.

DETAILED DESCRIPTION OF THE PREFERRED EMBODIMENTS

Figure 5:
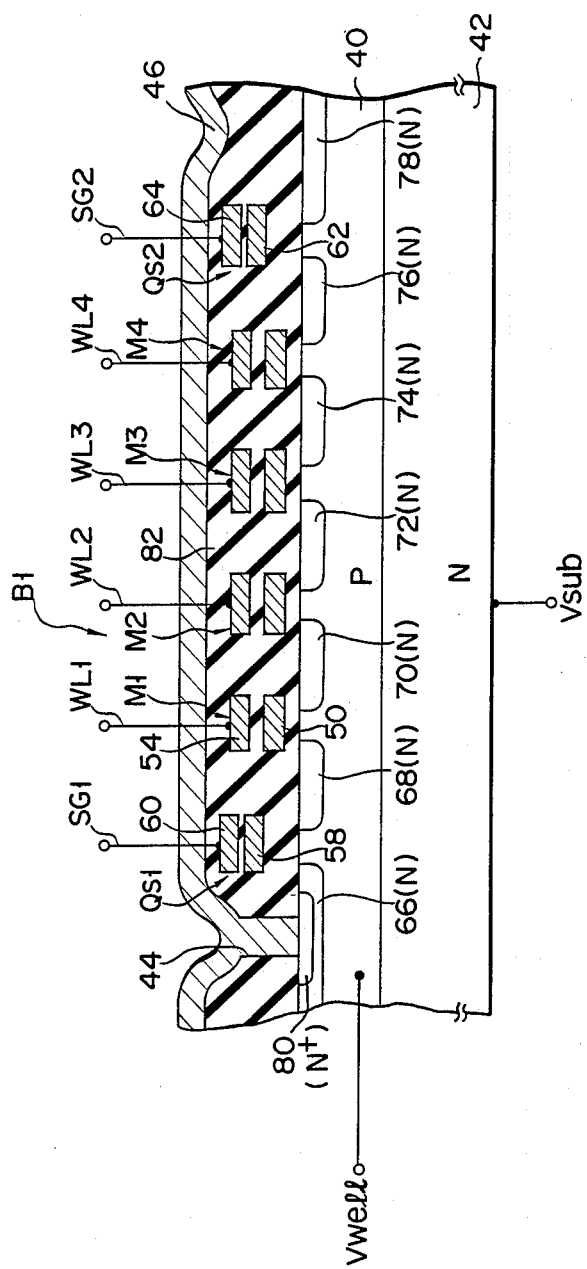
FIG. 5 is a sectional view of the NAND cell block of FIG. 3, taken along the line 5—5 of FIG. 3.

Referring now to FIG. 1, an electrically erasable programmable read-only memory according to a preferred embodiment of the invention has a memory cell section 10. Memory cell section 10 is associated with a row decoder 12, a sense amplifier section 14 and a column decoder 16. Memory section 10 is provided, as shown in FIG. 2, with memory cells M at intersections of a selected number of parallel bit lines BL1, BL2, ... , BLn and parallel word lines WL1, WL2, .... A reference symbol BLi is used hereinafter to specify an arbitrary one of the bit lines. Sense amplifier 14 is connected to bit lines BL so as to sense output voltages thereon.

A latch circuit 18 is connected to column decoder 16 and temporarily store input data to or output data from cell section 10. Latch circuit 18 has a latch capacity corresponding to the number of bit lines BL of cell section 10. A row address buffer unit 20 is connected to row decoder 12 and has address input terminals 21 to which address signals are externally applied. A column address buffer u it 22 is connected to column decoder 16 and has address input terminals 23 to which address signals are externally applied. Input data is applied from an I/O line terminal to latch 18 via data input buffer unit 24. Output data is applied from latch 18 to the I/O line terminal via I/O sense amplifier 26 and data output buffer unit 28. Where the EEPROM performs data accessing in page mode, one-page data (data of bits which are equal in number to bit lines BL of cell section 10) is temporarily stored in latch 18 and then transferred to bit lines BL so that the data is written into selected memory cells connected to bit lines BL.

A static random access memory (referred to as "SRAM" hereinafter) 30 is additionally provided between a data input buffer 24 and latch 18. SRAM 30 has a larger storage capacity than latch 18. In this embodiment, SRAM 30 has a storage capacity of 256×4 bits (the product of the number of bit lines BL and the number of memory cells M1 through M4 in each cell block Bi), namely, 1 Kbits. In other words, SRAM 30 has a static memory cell matrix which has series arrays of static memory cells corresponding in number to stages in a NAND block (four in this embodiment), each array having a page length corresponding to the number of bit lines BL. Write data to be entered into cell section 10 is stored in SRAM 30 first, and then stored data corresponding to plural pages are sequentially applied to latch 18 page by page. The installation of SRAM 30 contributes to reduction in the time required for data writing and thus improvement in the page mode accessing speed.

As shown in FIG. 2, the memory cells connected to bit lines BL of memory section 10 are divided into subarrays (referred to as "NAND cell blocks" or simply as "cell blocks" hereinafter) B11, B12, ... , each of which has first and second selection transistors Qs1 and Qs2, and a selected number of memory cells M. Selection transistor Qs is formed of a single-gate MOSFET. Each of selection transistors Qs1 and Qs2 is formed of a single-gate MOSFET. Each of memory cells M is essentially formed of a double-gate MOSFET which has a floating gate and a control gate. In the circuit arrangement of FIG. 2, only NAND cell blocks B1, B2, ... , Bn, which are connected to bit lines BL1, BL2, ... , BLn, respectively, are depicted in detail only for the purpose of simplifying illustration.

The transistor series combination of each NAND cell block Bi has one end (i.e., the drain of memory cell transistor Mli) connected to corresponding bit line BLi via first selection transistor Qsil and the other end (i.e., the source of memory cell transistor M4i) connected to substrate potential Vs. In this embodiment memory cells M of each cell block Bi are comprised of memory cell transistors M1, M2, ... , Mn which are series connected to constitute the so-called "NAND cell" structure. In the following description the number of the memory cell transistors in each cell block is set to as low as four only for the purpose of simplifying illustration. In practical applications, however, the number of memory cell transistors will be eight or sixteen.

Selection transistors Qs and memory cell transistors M are placed at intersections of bit lines BL and word lines WL as shown, thereby forming a cell matrix. However, lines SG1 and SG2 connected to selection transistor Qsil of each cell block Bil may be called a gate control line in this description.

As shown in FIG. 3, a NAND cell block (e.g. B1) has a series array of FETs which are formed in a well diffusion layer 40 formed in the surface portion of an N type silicon chip substrate 42 (see FIG. 4). NAND cell block B1 has a contact hole 12 on P type well layer 40. More specifically, a connection line (aluminum wiring) 46 is formed to insulatingly run over the series connection of FETs Qs and M. The wiring overlies the gates of FETs Qs and M included in cell block B1. Gate control lines SG1 and SG2 and word lines WL11, WL12, WL13, WL14 are formed over P type well layer 40 perpendicular to the direction in which wiring 46 runs, thereby defining selection transistors Qs1 and Qs2 and memory cells M1 through M4 (in FIG. 3 the memory cell transistors of this cell block are simply indicated as "M1", "M2", "M3", "M4") of NAND cell block B1.

Referring to FIGS. 4 and 5, the transistor array of NAND cell block B1 is formed in a substrate surface area surrounded with a insulating layer 48 for device isolation formed in the surface portion of P-well layer 40. P-well layer 40 is formed on the surface of substrate 40 widely enough for memory section 10 to be formed therein. P-well layer 40 is separated from another P-well layer (not shown) in which a peripheral circuit including row decoder 12, sense amplifier section 14, column decoder 16, etc. is formed. As most clearly shown in FIG. 4, MOSFET M1 constituting one memory cell has a first polysilicon layer 50 disposed over substrate 10 with a thermal oxide layer 52 interposed therebetween and a second polysilicon layer 54 disposed over layer 50 with a thermal oxide layer 56 interposed therebetween. First polysilicon layer 50 functions as the floating gate of MOSFET M1, whereas second polysilicon layer 54 functions as the control gate of MOSFET M1. The other memory cells have the same structure as described above.

Control gate layer 54 is connected to a corresponding word line (word line WL1 in the case of memory cell M1). As shown in FIG. 4, floating gate 50 is formed to overlap the device isolating region whereby, in each cell Mi, coupling capacitance Cfs between floating gate 50 and substrate 42 is made smaller than coupling capacitance Cfc between floating gate 5 and control gate 54. This thus enables the data writing/erasing only through the transfer of electrons between floating gate 50 and substrate 42 due to the tunnel effect. Selection transistor Qs1 has a polysilicon layer 58 insulatingly disposed over P-well layer 40 of substrate 42. Another polysilicon layer 60 is deposited over layer 58, and these layers 60 and 58 are electrically connected to each other by conductive through-holes (not shown) so as to function as the control gate of first selection transistor Qs1. The control gate of second selection transistor Qs2 is also formed of a multilayer structure consisting of polysilicon layers 62 and 64. Such a multilayer structure results in low resistance of the gates of selection transistors Qs1 and Qs2.

As shown in FIG. 5, N type diffusion layers 66, 68, 70, 72, 76, 78 are formed in the surface portion of P-well layer 40 of substrate 10 in such a way that they somewhat overlap the gates of transistors Qs and M. The N diffusion layers serve as the sources and drains of corresponding transistors. For example, N diffusion layers 66 and 68 serve as the drain and source of selection transistor Qs1, respectively. Similarly, N diffusion layers 68 and 70 serve as the drain and source of cell transistor M1, respectively.

The above layer structure is completely covered with a CVD insulating layer 82. A through hole 44 is formed in CVD insulating layer 82 as shown. An aluminum wiring layer 46 is deposited on CVD insulating layer 82. Wiring layer 46 extends along the series connection of transistors Qs and M and overlies the gates of transistors Qs and M in cell block B1. Contact hole 44 is positioned on drain diffusion layer 66 of selection transistor Qs1. Aluminum wiring layer 46 runs on CVD insulating layer 82 and contacts drain diffusion layer 66 of selection transistor Qs1 through contact hole 44. In a portion of N diffusion layer 66 that contacts contact hole 44 there is formed a heavily-doped N type (N+ type) diffusion layer 80, thereby reducing the ohmic contact resistance between wiring layer 46 and the drain of selection transistor Qs1. Wiring layer 46 is selectively connected to a data input line or a data output line.

According to this embodiment, both of the control gate and floating gate of each memory cell transistor have a width of 1 'm, and the channel width of each memory cell transistor is also set to 1 $\mu$m. The floating gate is protruded from both ends of 1-$\mu$m-wide wiring layer 46 by 1 $\mu$m. First gate insulating layer 52 is a thermal oxide layer of 20 nm thickness, whereas second gate insulating layer 56 is a thermal oxide layer of 35 nm thickness. Assuming the dielectric constant of these thermal oxide layers to be $\epsilon$, coupling capacitances Cfs and Cfc described above will be given by $$Cfs = \epsilon/0.2$$

$$Cfc = 3\epsilon/0.035$$

It will thus be understood that the NAND cell structure of this embodiment satisfies the above condition.

The operation of the EEPROM constructed as above will be described with reference to the signal waveform diagram of FIG. 6. The EEPROM is arranged to perform a simultaneous erase operation prior to selective writing of data in which case data stored in all memory cells M of cell section 10 are simultaneously erased. NAND cell block B1 in the memory cell matrix in FIG. 2 will be taken as an example in describing the simultaneous erase operation. At time t1, a "L" level potential (e.g. 0 volts) is applied to control gate lines SG1 and SG2 as shown in FIG. 6, so that selection transistors Qs1 and Qs2 are rendered nonconductive and hence cell block B1 is electrically disconnected from the corresponding line BL1. A "L" level potential is applied to word lines WL1 through WL4, so that substrate potential Vsub and well potential Vwell are set to a "H" level potential (e.g. 18 volts). The potential Vbit of the bit lines including bit lines BL1 and BL2 is set to a "H" level potential (18 volts). Thus, an electric field is generated between control gate 54 (see FIG. 5) of each of all memory cells M including memory cells M1 through M4 (when a certain NAND cell block is specified, its memory cells are simply indicated as "M1", ..., "M4" hereinafter) and P-well layer 40 with the result that electrons are discharged from floating gate 50 to P-well layer 40 due to tunneling. Consequently, the threshold of each memory cell M shifts in the negative direction to provide a logic "0" stored state.

Subsequently the EEPROM is set to a data write mode at time t2. When NAND cell block B1 is selected, the EEPROM writes data into memory cells M1 through M4 in selected NAND cell block B1 in sequence. In this case, memory cell M1 which is most distant from the connection point (which may be considered to be the drain of first selection transistor Qs1) between NAND cell block B1 and the corresponding bit line BL associated therewith is subjected to data writing first, and memory cell M1 which is nearest to the connection point is subjected to data writing last. Namely, the sequential data writing is performed in the order of M4, M3, M2, M1.

In a data write mode, as shown in FIG. 6, a turn-on voltage, which is an intermediate voltage which is half of a boosted voltage Vpp, 10 volts in this example, is applied to control gate line SG1 so as to render first selection transistor Qs1 conductive so that cell block B1 may be electrically connected to corresponding bit line BL1. Control gate line SG2 is maintained at a "L" level potential (e.g. 0 volts) with the result that second selection transistor Qs2 is rendered nonconductive and thus cell block B1 is electrically disconnected at the source of memory cell transistor M4 from P-well layer 40. At the same time, substrate potential Vs and well potential Vwell are set to a "L" level potential (0 volts).

To write data into memory cell M4 first, a "H" level potential, which may be ranged from 12 to 20 volts; for example, 20 volts, is applied to word line WL4 connected to the control gate of selected memory cell M4 at time t2, whereas a "L" level potential (0 volts) is applied to nonselected word lines WL1 through WL3. The potential Vbit1 of selected bit line BL1 is set to a "L" level potential (18 volts), whereas the potential Vbit2 of nonselected bit line BL2 is set to the intermediate potential (10 volts). Voltage Vcg4 of the control gate of selected cell M4 is set to a "H" level potential, while voltages Vcg1, Vcg2, Vcg3 of the control gates of the remaining cells M1 through M3 are set to the intermediate potential as shown in FIG. 6. As a result, a high electric field is generated between control gate 54 and N-drain layer 76 and between control gate 54 and P-well layer 40 of selected memory cell M4 so that electrons are tunneled from drain layer 76 and well layer 40 into floating gate 50 of selected memory cell M4. The threshold of selected memory cell M4 thus becomes more positive so that logic "1'" data is stored in cell M4. At this time the thresholds of nonselected cells M1 through M3 exhibit no substantial variation and thus maintain the logic "0" stored state. Since the control gate voltages of cells M1 through M3 are set to the intermediate potential as described above, the electric field generated in each cell is not so strong as to force electrons toward the floating gate. The thresholds of memory cells M of nonselected cell block B2 adjacent to selected NAND cell block B1 exhibit no substantial variation, thus maintaining the logic "0" stored state. This is because bit line potential Vbit2 of nonselected NAND cell block B2 is set to the intermediate potential and thus such a strong electric field as to cause the tunneling of electrons into their floating gates is not generated in these memory cells.

When, in selected NAND cell block B1, memory cell M3 is selected after memory cell M4, a "H" level potential (20 volts) is applied to word line WL3 at time t3 with the result that control gate voltage Vcg3 of memory cell M3 goes to a "H" level potential. The control voltages Vcg1, Vcg2, Vcg4 of the remaining cells M1, M2 and M4 go to the intermediate potential as shown in FIG. 6. Consequently, a high electric field is generated in selected memory cell M3 in accordance with the same manner as described above so that electrons are tunnel-injected into floating gate 50. The threshold of selected memory cell M3 thus becomes more positive so that logic "1" data is stored in M3. Subsequently, the remaining cells M2 and M1 are sequentially written into in accordance with the writing technique described above.

When the EEPROM is set to a data read mode at time t6, a turn-on voltage (e.g. 5 volts) is applied to control gate lines SG1 and SG2 as shown in FIG. 6, thus rendering selection transistors Qs1 and Qs2 conductive to electrically connect cell block B1 to corresponding bit line BL1 and well potential Vwell. At this time substrate potential Vsub and well potential Vwell are set to a "L" level potential (0 volts).

To read the stored data from memory cell M4 of NAND cell block B1, for example, a reading "H" level potential (e.g. 5 volts) is applied to bit line BL1, while a "L" level potential (0 volts) is applied to bit line BL2. By applying a "L" level potential (0 volts) to word line WL4 connected to cell M4, its control gate potential Vcg4 is set to a "L" level potential (0 volts). At this time the remaining cells M1 through M3 are maintained at the "H"level potential (5 volts). As a result, first selection transistor Qs1 and cells M1 through M3 are rendered conductive and selected cell M4 is electrically connected to corresponding bit line BL1. By detecting whether a current flows through bit line BL1 or not through sense amplifier 14, the determination can be made as to whether the data stored in cell M4 is either a logic "1" or a logic "0".

Figure 7:
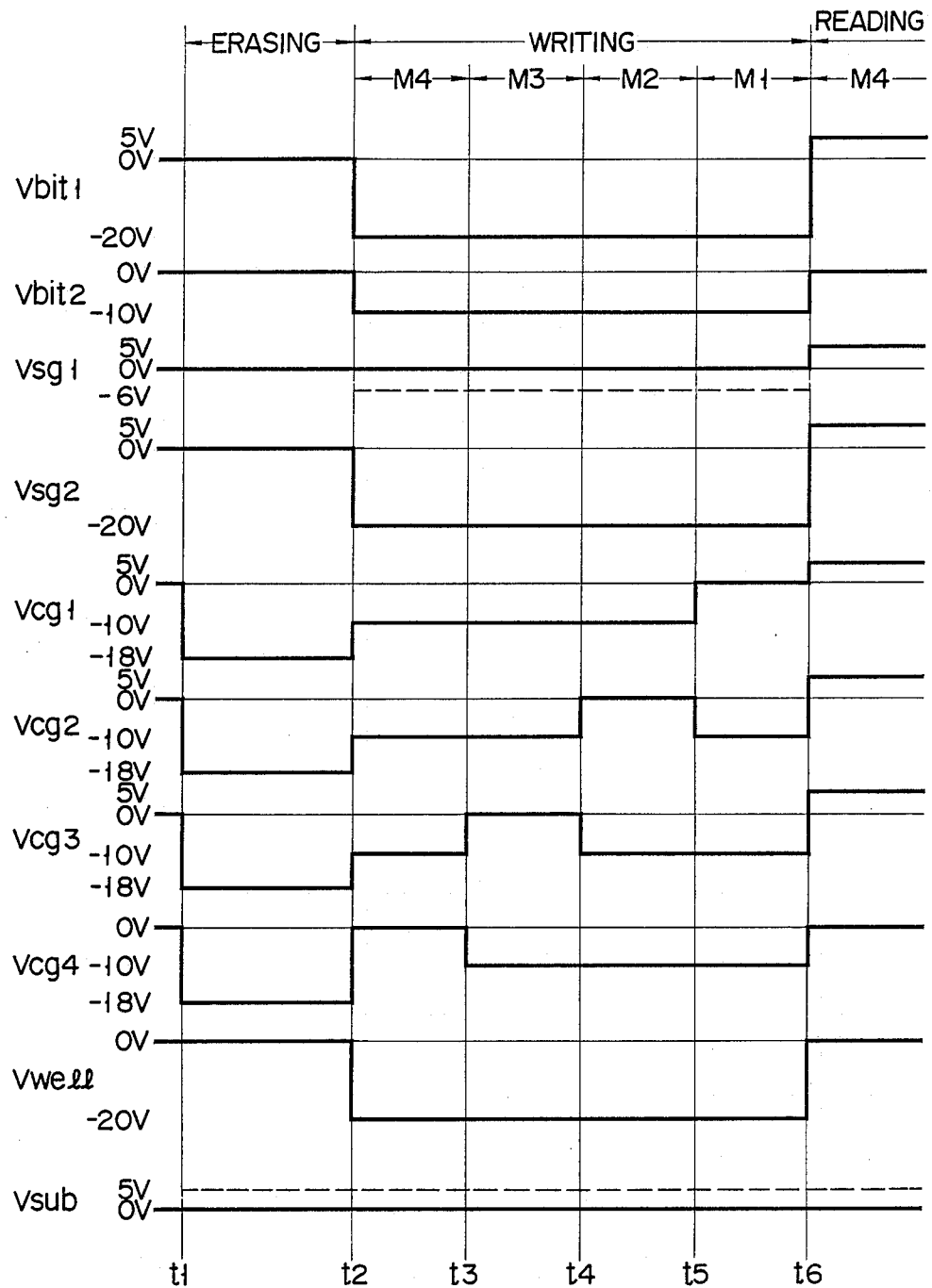

The simultaneous erasing of the EEPROM and the voltage application scheme for selective data writing may be modified as shown in FIG. 7. According to the voltage application technique disclosed here, substrate potential Vsub is constantly maintained at a "L" level potential (ranged from 0 to 5 volts; e.g. 0 volts) through the simultaneous erase mode and the write mode. In the simultaneous erase mode performed during an interval between t1 and t2, a "L" level potential (0 volts) is applied to control gate lines SG1 and SG2 as shown in FIG. 7 so that selection transistors Qs1 and Qs2 are rendered conductive, thus electrically disconnecting each cell block Bi from corresponding bit line Bi. A negative boosted potent (e.g. −18 volts) is applied to word lines WL1 through WL4. In this case well potential Vwell and potential Vbit of all the bit lines including bit lines BL1 and BL2 are set to ground potential (0 volts). By such a voltage application, in all the memory cells M including memory cells M1 through M4, electrons are discharged from their floating gates 50 to P-well layer 40 due to tunneling in accordance with the same manner as the above erase mechanism. Consequently, all the memory cells M are erased simultaneously.

In the data write mode, a voltage, which may be ranged from 0 volts to −6 volts, e.g., 0 volts, is applied to control gate line SG1 so that first selection transistor Qs1 is rendered nonconductive to electrically disconnect cell block B1 from bit line BL1. A negative boosted voltage (e.g. −20 volts) is applied to control gate line SG2 so that second selection transistor Qs2 is rendered nonconductive, thus electrically disconnecting cell block B1 at the source of memory cell transistor M4 from P-well layer 40. At this time well potential Vwell is also set to the negative boosted voltage (−20 volts).

As in the previous case, cell M4 is subjected to data writing first. At this time ground potential (0 volts) is applied only to word line WL4, whereas a negative intermediate voltage (−10 volts) is applied to the remaining word lines WL1 through WL3. Potential Vbit1 of selected bit line BL1 is set to a negative boosted voltage (−20 volts) and potential Vbit2 of nonselected bit line BL2 is set to a negative intermediate voltage (−10 volts). Consequently, a strong electric field is generated in selected cell M4 in accordance with the same manner as above so that the tunneling of electrons into the floating gate takes place, causing logic "1" data to be written into M4.

According to the embodiment, a current that flows in a selected cell during the simultaneous erase mode or the data write mode consists essentially of a tunnel current flowing between P-well layer 40 formed in substrate 42 and the floating gate of the selected cell and a leak current flowing between each of the N-diffusion layers serving as the source and drain of the selected cell and P-well layer 40 (or a leak current flowing through the junction between substrate 42 and P-well layer 40). The current is thus extremely small, not more than 10 μA. This fact greatly contributes to suppression of the power dissipation in the EEPROM.

Further, according to the embodiment, semiconductor diffusion layers 66, 68, 70, 72, 74, 76, 78 serving as the sources and drains of memory cells M in each NAND cell block are surrounded with well layer 40 having a conductivity type opposite to that of substrate 42. Since well layer 40 can effectively prevent the generation of the surface breakdown in those diffusion layers, the undesirable variation of the thresholds of nonselected cells can be avoided in writing data into a selected cell. Therefore, the EEPROM can be improved in its operational efficiency and reliability.

Furthermore, during the data write mode all the NAND cell blocks B including selected NAND cell block (B1) are electrically isolated from well potential Vwell and substrate potential Vsub by rendering selection transistors Qs2 therefor nonconductive. Accordingly, a current flow path between bit lines BL and substrate 42 can completely be interrupted so that an internal leak current is eliminated that tends to flow through the path. This leads to reduction in the power dissipation of the EEPROM.

Figure 8:
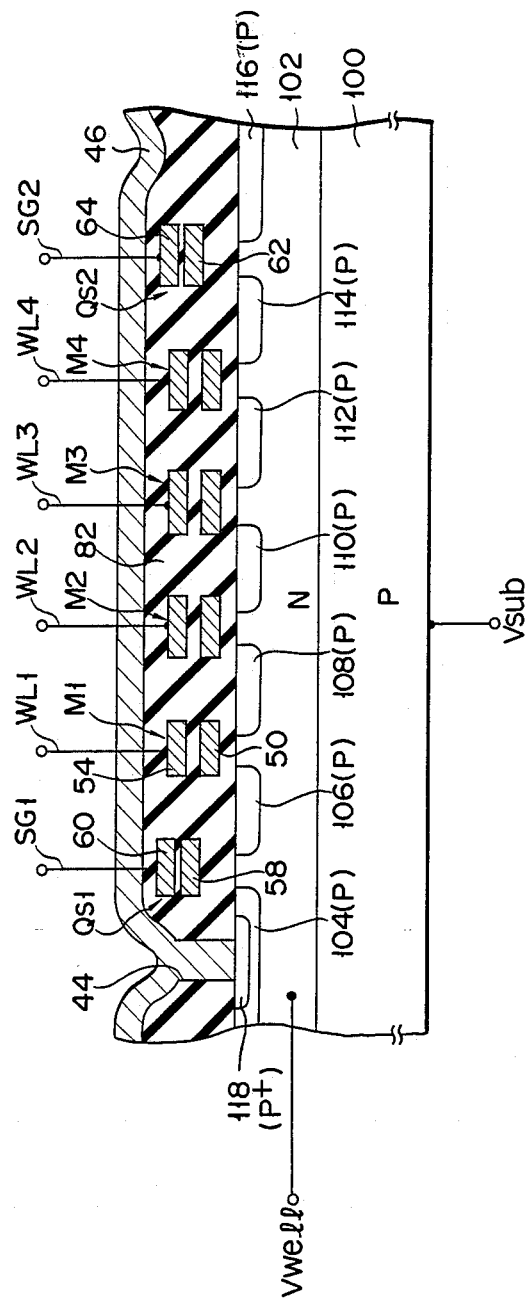
FIG. 8 a modification of the NAND cell block of FIG. 5.

The EEPROM may be modified such that each NAND cell block Bi is formed on P-type chip substrate 100 as shown in FIG. 8. In this case, first and second selection transistors Qs1 and Qs2 and memory cells M1 through M4 of NAND cell block B1 are each formed of a P-channel MOSFET which is formed in N-well layer 102. N-well layer 102 is formed in a surface portion of P-well substrate 100 as shown in FIG. 8. P-type semiconductor diffusion layers 104, 106, 108, 10, 112, 114, 116 serving as the sources and drains of transistors Qs1, Qs2 and M1 through M4 are formed in array in N-well layer 102. P type diffusion layers 104 each have a heavily-doped P type diffusion layer 118 at the contact portion with contact hole 44. Since the other portions of NAND cell block B1 of FIG. 8 are the same as those of the previous embodiment, the same symbols as those used in FIG. 5 are used again and the detailed description thereof is omitted.

Figure 9:
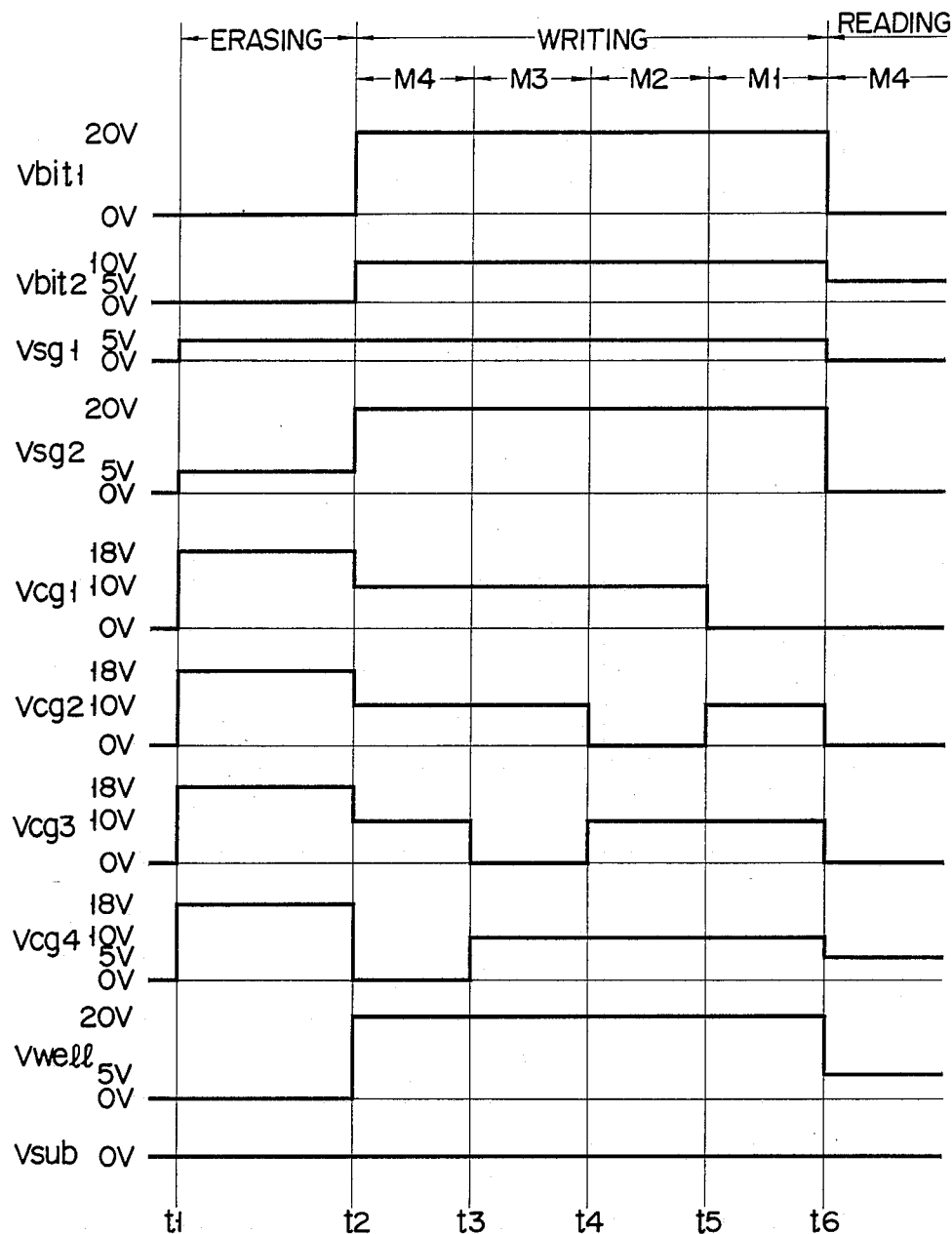
FIG. 9 illustrates waveforms of main electrical signals appearing in main portions of the EEPROM having the sectional structure of FIG. 5 during its various modes of operation.

With the EEPROM having such a structure, substrate potential Vsub is constantly maintained at ground potential (0 volts) through the simultaneous erase, write and read modes. In the simultaneous erase mode performed during interval between t1 and t2, a potential of 5 volts is applied to control gate lines SG1 and SG2 as shown in FIG. 9 so that selection transistors Qs1 and Qs2 are rendered conductive, thus electrically disconnecting each cell block Bi from corresponding bit line Bi. A positive boosted potential (e.g. 18 volts) is applied to word lines WL1 through WL4. In this case well potential Vwell and potential Vbit of all the bit lines including bit lines BL1 and BL2 are set to ground potential (0 volts). By such a voltage application scheme, in all the memory cells M including memory cells M1 through M4, electrons are tunneled from their floating gates 50 back to P-well layer 40 in accordance with the same manner as the above erase mechanism. Consequently, all the memory cells M are erased simultaneously.

In the data write mode, a voltage of 5 volts is applied to control gate line SG1 so that first selection transistor Qs1 is rendered nonconductive, thereby electrically disconnecting cell block B1 from bit line BL1. A positive boosted voltage (e.g. 20 volts) is applied to control gate line SG2 so that second selection transistor Qs2 is rendered nonconductive, thus electrically disconnecting cell block B1 at the source of memory cell transistor M4 from N-well layer 102. At this time well potential Vwell is also set to the positive boosted voltage (20 volts).

As in the previous case, cell M4 is subjected to data writing first. At this time ground potential (−0 volts) is applied only to word line WL4, whereas a positive intermediate voltage (10 volts) is applied to the remaining word lines WL1 through WL3. Potential Vbit1 of selected bit line BL1 is set to a positive boosted voltage (20 volts) and potential Vbit2 of nonselected bit line BL2 is set to a positive intermediate voltage (10 volts). Consequently, a strong electric field is generated in selected cell M4 in accordance with the same manner as described above so that electrons are tunneled from the floating gate back to N-well layer 102 and thus the threshold of cell M4 shifts in the negative direction, causing logic "1" data to be written into M4. Similarly, the selective data writing will be performed on cells M in the order of M3, M2, M1.

In the data read mode, for example, when cell M4 is selected, gate voltages Vsg1 and Vsg2 of first and second selection transistors Qs1 and Qs2, control gate voltages Vcg1 to Vcg3 of nonselected cells M1 to M3, and voltage Vbit1 of selected bit line BL1 are set to ground potential (0 volts). At this time selected bit line BL2 and well potential Vwell are set to 5 volts. Control gate voltage Vcg4 of selected cell M4 is set to 5 volts by applying 5 volts to word line WL4. Consequently, the readout voltage corresponding to the stored data in selected cell M4 is transferred to bit line BL1 via nonselected cell transistors M1 to M3 which has been rendered conductive and then subjected to the logic level discrimination in the same manner as described above.

Figure 10:
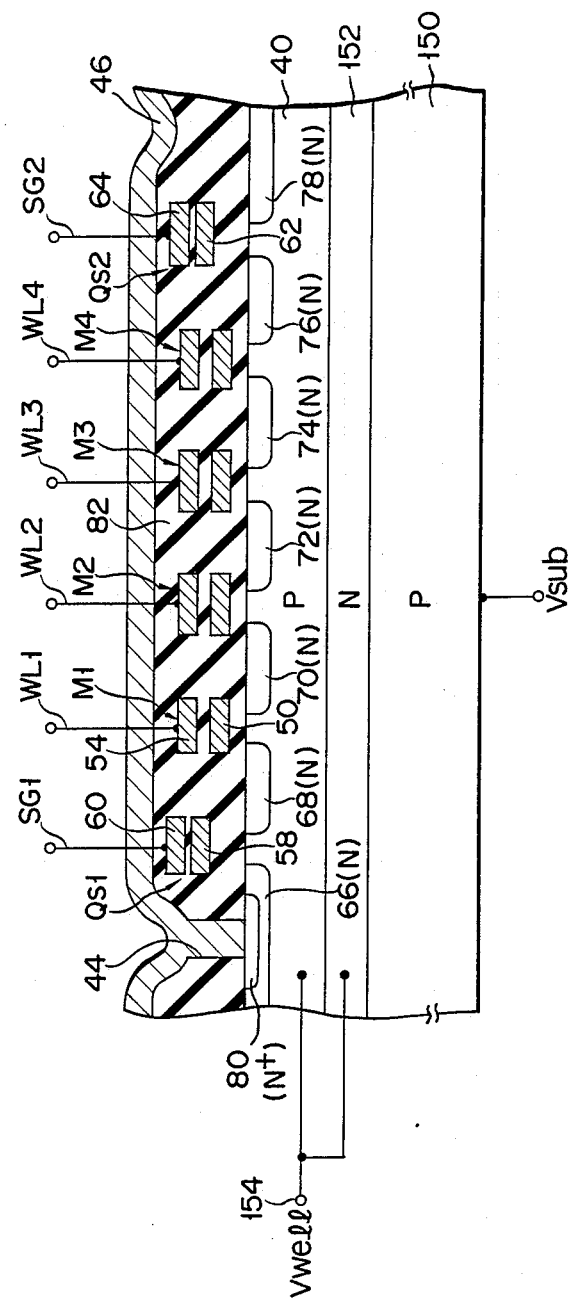
FIG. 10 shows another modification of the sectional structure of the NAND cell block of FIG. 5.

The EEPROM may be modified such that the NAND cell structure with memory cells M consisting of N channel MOSFETs as shown in FIG. 5 is formed in P-type chip substrate 150 as shown in FIG. 10. In this case, an N-well layer 152 is additionally formed in P-substrate 150 so as to surround P-well layer 40 in which first and second selection transistors Qs1 and Qs2 and N type diffusion layers 66, 68, 70, 72, 76, 78 serving as the sources and drains of memory cells M1 to M4 of NAND cell block B1 are formed. P-well layer 40 and N-well layer 152 are connected together to a terminal 154 so that they are at the same potential. The simultaneous erase, write and read operations of this modifications are performed by the use of the same voltage application scheme as that in the previous modification of FIG. 8.

Figure 11:
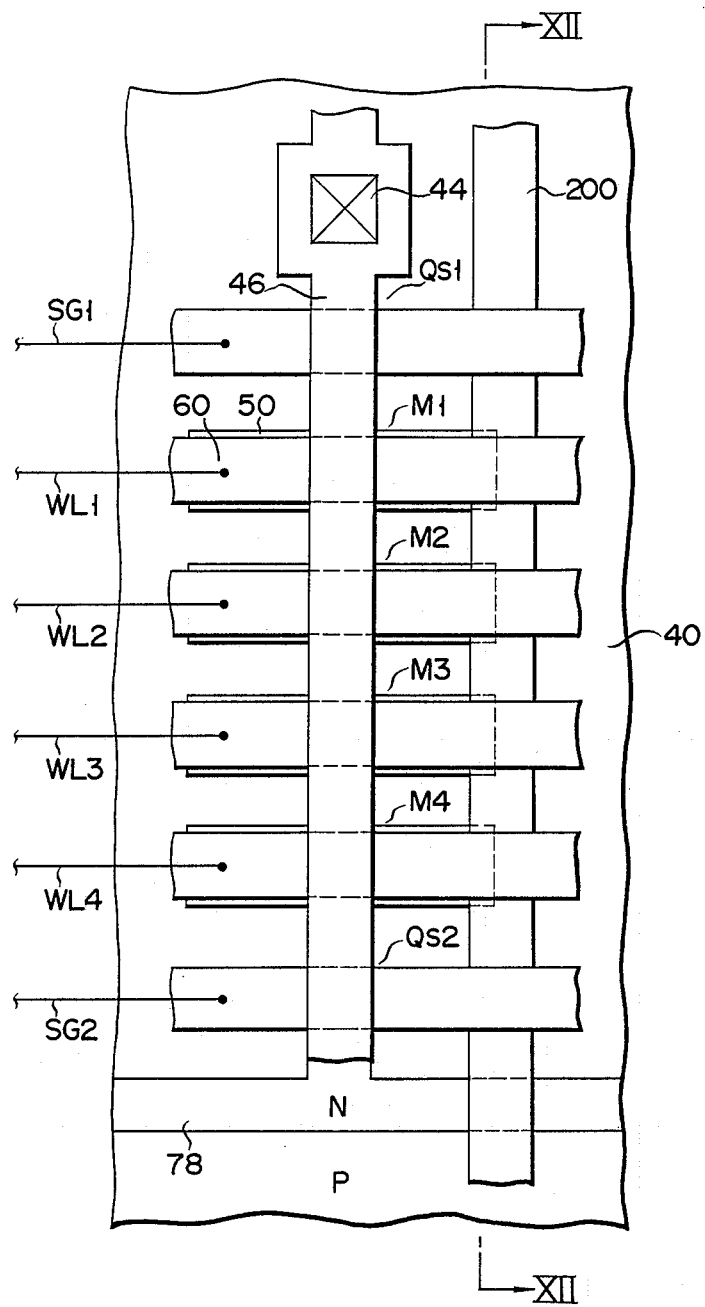
FIG. 11 is a plan view of a certain NAND cell block of an electrically erasable programmable read-only memory according to another embodiment of the invention.

The plan configuration of NAND cell block B1 of the EEPROM according to still another modification has a "three-gate structure" as shown in FIG. 11. More specifically, an erase gate layer 200 is insulatingly provided between floating gates 50 and control gates 54 of series-arrayed memory cell transistors M1 to M4 of NAND cell block B1 so as to run perpendicular to those gates. Floating gates 50 overlap erase gate 200 as shown. Erase gate layer 200 is formed of a polysilicon layer which runs parallel to aluminum wiring layer 46. The polysilicon layer is ranged in thickness from 100 to 400 nm. The cell sectional structure taken along aluminum wiring layer 46 is exactly the same as that in the embodiment of FIG. 5.

Figure 12:
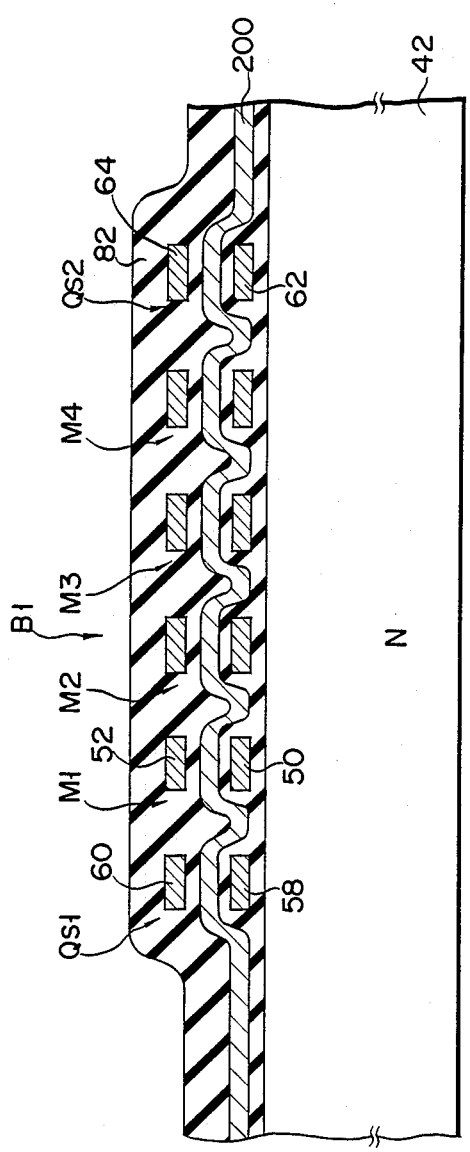
FIG. 12 is a sectional view of the NAND cell block of FIG. 11, the line 12—12 of FIG. 11.

The sectional structure taken along erase gate layer 200 is shown in FIG. 12 wherein like reference symbols are used to denote like portions in FIG. 5. As shown in FIG. 12, erase gate layer 200 is also insulatingly sandwiched between double-layered gates 58 and 60 (62 and 64) of each of first and second selection transistors Qs1 and Qs2 provided at the opposite ends of the series array of cell transistors M1 to M4. In each memory cell transistor, floating gate 50 and control gate 52 are capacitively coupled to each other through erase gate 200. An equivalent circuit of NAND cell block B1 having the "three-gate" structure is shown in FIG. 13 wherein erase gate 200 of NAND cell block B1 and the erase gate of another NAND cell block B2 adjacent to B1 are connected together to gate control voltage Veg.

In the simultaneous erase mode, voltage Veg on erase gate 200 is set a boosted potential (20 volts) as shown in FIG. 14. Well potential Vwell and substrate potential Vsub are constantly maintained at ground potential (0 volts) during all the operation modes including the simultaneous erase mode. Gate voltages Vsg1 and Vsg2 of first and second selection transistors Qs1 and Qs2 are set to a voltage which may be ranged from 0 to 5 volts (e.g. 0 volts). Voltage Vbit on all bit lines BL and voltages Vcg1 to Vcg4 on word lines WL1 to WL4 are set to ground potential (0 volts). Consequently, in NAND cell block B1, electrons accumulated at floating gates of memory cells M1 to M4 are simultaneously discharged to erase gate 200 due to tunnel effect so that all the memory cells M are erased simultaneously. The selective writing and reading is performed in the same way as in the embodiment having P-well layer 40.

With such an arrangement, since floating gate 50 and control gate 54 of each of memory cells M are partly capacitively coupled to each other, no high gate voltage is needed for erasing data. Hence, this will enable the reduction of the power dissipation in the EEPROM and the simplification of the peripheral circuit arrangement. Further, since, in each cell, a region through which tunnel current flows to erase data is relatively narrow, when the EEPROM is repeatedly subjected to the simultaneous erase, the degradation of the quality of polycrystalline silicon gate insulating layer 52 (see FIG. 4) of NAND cell block B1 can be minimized. Thus the operational reliability of the EEPROM can be improved. This type of NAND cell structure may be directly formed on a chip substrate without the use of P-well layer 40, if desired.

What is claimed is:

1. A non-volatile dynamic semiconductor memory device comprising:
    (a) a semiconductive substrate having a major surface;
    (b) a semiconductive well region formed in said surface of said substrate, said well region being provided separate from a well region in which transistors are formed to constitute a peripheral circuit of said memory device;
    (c) parallel bit lines provided above said substrate;
    (d) rewritable memory cells connected to said bit lines, said memory cells comprising NAND cell blocks each of which has a series array of memory cell transistors, each of said memory cell transistors having a charge accumulation layer, a control gate and semiconductive layers formed in said well region to function as sources and drains, and said well region functioning as a surface breakdown prevention layer; and
    (e) control means for writing data into memory cells of a selected NAND cell block sequentially during a data write mode subsequent to the data erase mode, said control means applying, when a certain memory cell of said selected NAND cell block is subjected to writing, to said control gate of said certain memory cell a voltage to form such a strong electric field as to allow the transfer of charges between said charge accumulation layer of said certain memory cell and said well region.

2. The device according to claim 1, wherein said substrate has a first conductivity type, said well region has a second conductivity type and said semiconductive layers have the first conductivity type.

3. The device according to claim 1, wherein said substrate and said well region have a first conductivity type and said semiconductive layers have a second conductivity type; and wherein said device further comprises an additional well region of the second conductivity type formed in said substrate so as to surround said well region.

4. The device according to claim 3, wherein said well regions are connected to a common well potential.

5. The device according to claim 1, wherein said selected NAND cell block comprises:
    a first selection transistor provided at one end of said selected NAND cell block and selectively rendered conductive for electrically connecting said selected NAND cell block to a corresponding bit line associated therewith; and
    a second selection transistor provided at the other end of said selected NAND cell block and selectively rendered conductive for electrically connecting said selected NAND cell block to said well area, said second selection transistor being rendered nonconductive during the data write mode so as to prevent leakage of current between said corresponding bit line and said substrate.

6. The device according to claim 1, wherein each of said NAND cell blocks comprises:
    an erase gate layer provided insulatingly over said substrate so as to extend substantially parallel to said series array of memory cell transistors and sandwiched insulatingly by said charge accumulation layer and said control gate of each of said memory cell transistors, said erase gate layer overlapping said charge accumulation layer and said charge accumulation layer and said control gate being capacitively coupled to each other by said erase gate layer.

7. An erasable programmable read-only memory device comprising:
    (a) a semiconductive substrate having a semiconductive well layer formed in its major surface;
    (b) parallel bit lines provided over said substrate;
    (c) parallel word lines intersecting said bit lines insulatingly;
    (d) double-gate field effect transistors provided at intersections of said bit lines and said word lines for functioning as memory cells, said transistors including a cell array which has a series-circuit of cell transistors constituting a NAND cell block, each of said cell transistors having semiconductor layers serving as a source and a drain thereof, an electrically floating gate layer serving as a charge accumulation layer and a control gate layer connected to a corresponding word line, said semiconductor layers being formed in said well layer;
    (e) a field effect transistor provided at one end of said NAND cell block and selectively rendered conductive for serving as a first selection transistor;
    (f) a field effect transistor provided at the other end of said NAND cell block and selectively rendered conductive for serving as a second selection transistor; and (g) driving means for, when said NAND cell block is selected during a data write mode of said device, (1) rendering said first selection transistor conductive to electrically connect said NAND cell block to a corresponding bit line associated therewith to which write data is applied, (2) rendering said second selection transistor nonconductive to electrically disconnect said NAND cell block from said well layer, and (3) writing data into memory cells of said NAND cell block sequentially, said driving means changing a potential of said well layer to have a level different from that of a potential of said well layer in a simultaneous erase mode prior to the data write mode of said device.

8. The device according to claim 7, wherein said driving means writes data into memory cells of said NAND cell block in a predetermined sequence in which a cell transistor adjacent to said second selection transistor is subjected to writing first and a cell transistor adjacent to said first selection transistor is subjected to writing last.

9. The device according to claim 8, wherein said driving means applies, when a certain memory cell of said NAND cell block is subjected to writing, to said control gate of said certain memory cell a first voltage to form such a strong electric field as to allow the transfer of charges between said charge accumulation layer of said certain memory cell and said well layer and to the remaining memory cells of said NAND cell block a second voltage lower than the first voltage.

10. The device according to claim 9, wherein said substrate has a first conductivity type, said well layer has a second conductivity type and said semiconductive layers have the first conductivity type.

11. The device according to claim 10, wherein said driving means applies to said well layer one of a "H" level potential and a "L" level potential during the simultaneous erase mode and the other of the "H" level potential and the "L" level potential during the data write mode.

12. The device according to claim 9, wherein said substrate and said well layer have a first conductivity type and said semiconductive layers have a second conductivity type; and wherein said device further comprises an additional well layer of the second conductivity type formed in said substrate so as to surround said well layer.

13. The device according to claim 12, wherein said driving means applies to said well layers a "L" level potential during the simultaneous erase mode and a "H" level potential during the data write mode.

14. The device according to claim 1, wherein said control means erases data stored in all said memory cells simultaneously during a data erase mode of said memory device.

15. A non-volatile dynamic semiconductor memory device comprising:

a semiconductor substrate having a major surface;

a semiconductor well region formed in said surface of said substrate, said well region being provided separate from a well region in which transistors are formed to constitute a peripheral circuit of said memory device;

parallel bit lines provided above said substrate;

rewritable memory cells connected to said bit lines, said memory cells comprising NAND cell blocks each of which has a series array of memory cell transistors, each of said memory cell transistors having a charge accumulation layer, a control gate and semiconductor layers formed in said well region to function as sources and drains, and said well region functioning as a surface breakdown prevention layer;

control means for erasing data stored in all said memory cells simultaneously during a data erase mode of said memory device and writing data into memory cells of a selected NAND cell block sequentially during a data write mode subsequent to the data erase mode, said control means applying, when a certain memory cell of said selected NAND cell block is subjected to writing, to said control gate of said certain memory cell a voltage to form such a strong electric field as to allow the transfer of charges between said charge accumulation layer of said certain memory cell and said well region;

a first selection transistor provided at one end of said selected NAND cell block and selectively rendered conductive for electrically connecting said selected NAND cell block to a corresponding bit line associated therewith; and a second selection transistor provided at the other end of said selected NAND cell block and selectively rendered conductive for electrically connecting said selected NAND cell block to said well area, said second selection transistor being rendered nonconductive during the data write mode so as to prevent leakage of current between said corresponding bit line and said substrate.

* * * * *